(12) United States Patent
Noda

(10) Patent No.: US 7,338,581 B2
(45) Date of Patent: Mar. 4, 2008

(54) SPUTTERING APPARATUS

(75) Inventor: Toshinari Noda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 600 days.

(21) Appl. No.: 10/890,126

(22) Filed: Jul. 14, 2004

(65) Prior Publication Data

US 2005/0011757 A1   Jan. 20, 2005

(30) Foreign Application Priority Data

Jul. 16, 2003  (JP)  ............................. 2003-197560

(51) Int. Cl.
*C23C 14/54* (2006.01)
*C23C 14/35* (2006.01)

(52) U.S. Cl. ............................. 204/298.02; 204/192.1; 204/192.12; 204/192.17; 204/192.3; 204/298.11; 204/298.07; 204/192.13; 204/192.15; 428/432; 156/345.24; 315/111.21; 356/630; 118/723 HC

(58) Field of Classification Search ......... 118/723 HC; 156/324.24; 204/192.1, 192.12, 192.13, 204/192.15, 192.22, 298.07, 298.11, 192.17, 204/192.3; 315/111.21; 428/432
See application file for complete search history.

(56) References Cited

U.S. PATENT DOCUMENTS

| | | | | |
|---|---|---|---|---|
| 4,405,989 A | * | 9/1983 | Tsukada et al. | ............. 356/630 |
| 5,178,739 A | * | 1/1993 | Barnes et al. | .......... 204/192.12 |
| 5,346,600 A | * | 9/1994 | Nieh et al. | ................ 204/192.3 |
| 6,022,461 A | * | 2/2000 | Kobayashi et al. | .... 204/298.07 |
| 6,077,403 A | * | 6/2000 | Kobayashi et al. | .... 204/192.12 |
| 6,106,676 A | * | 8/2000 | Terry et al. | ............. 204/192.13 |
| 6,140,773 A | * | 10/2000 | Anders et al. | .......... 315/111.21 |
| 6,150,030 A | * | 11/2000 | Stollenwerk et al. | ....... 428/432 |
| 6,165,312 A | * | 12/2000 | Smith et al. | ............ 156/345.24 |
| 6,361,667 B1 | * | 3/2002 | Kobayashi et al. | ..... 204/298.11 |
| 6,623,607 B1 | * | 9/2003 | Stollenwerk et al. | .. 204/192.15 |
| 6,676,814 B1 | * | 1/2004 | Stollenwerk et al. | .. 204/192.22 |
| 6,875,321 B2 | * | 4/2005 | Ding et al. | ............ 204/192.17 |

(Continued)

FOREIGN PATENT DOCUMENTS

JP         2-038310         2/1990

(Continued)

OTHER PUBLICATIONS

Noguchi, Masahiro. May 21, 2003. Japanese Patent Office Abstract. JP2003147529.*

*Primary Examiner*—Alexa D. Neckel
*Assistant Examiner*—Michael Band
(74) *Attorney, Agent, or Firm*—Wenderoth, Lind & Ponack, L.L.P.

(57) ABSTRACT

A sputtering apparatus includes paired targets 31 disposed in a vacuum chamber 30, substrate holder 33 disposed at a position nearly perpendicular to the paired target 31 and apart from a space formed by the paired targets 31, a plasma source 37 for generating reaction plasma by after-glow plasma in the vicinity of the substrate holder 33, and a lead-in pipe 38 which connects the plasma source 37 to the vacuum chamber 30. Since reaction plasma of after-glow plasma can be produced in the vicinity of the substrate holder 33, it is possible to form a thin film of compound close to bulk characteristics at a low substrate temperature without the film being damaged by plasma.

11 Claims, 5 Drawing Sheets

U.S. PATENT DOCUMENTS

| | | | |
|---|---|---|---|
| 7,165,506 B2* | 1/2007 | Stollenwerk | 118/723 HC |
| 2001/0009221 A1* | 7/2001 | Anzaki et al. | 204/192.12 |
| 2001/0050220 A1* | 12/2001 | Chiang et al. | 204/192.12 |
| 2003/0070913 A1* | 4/2003 | Miller et al. | 204/192.1 |
| 2003/0159925 A1* | 8/2003 | Sako | 204/298.07 |
| 2005/0011756 A1* | 1/2005 | Shibamoto et al. | 204/298.07 |

FOREIGN PATENT DOCUMENTS

| | | |
|---|---|---|
| JP | 6-252098 | 9/1994 |
| JP | 2003147529 A * | 5/2003 |

* cited by examiner

SPUTTERING APPARATUS

FIELD OF THE INVENTION

The present invention relates to a sputtering apparatus, and more particularly, it relates to a facing-targets sputtering apparatus which forms a thin film through a reactive sputtering process.

BACKGROUND OF THE INVENTION

A method of manufacturing reactive sputtered thin film by using a conventional facing-targets sputtering apparatus as disclosed in Japanese Laid-open Patent H2-38310. The method disclosed in this example is such that oxygen plasma is locally generated on the upper surface of a substrate, and then oxidation reaction occurs against particles sputtered from the target, thereby manufacturing an oxide superconductor film. FIG. 4 is a sectional outline drawing showing the configuration of an essential portion of a conventional opposed-target sputtering apparatus.

In FIG. 4, paired targets 4 are oppositely disposed at a spaced interval. At the backs of these targets 4 are respectively disposed magnets 3 for forming a magnetic field between paired targets 4. Substrate 5 is disposed in a direction perpendicular to the opposing direction of targets 4 and so as to face toward the space of the magnetic field formed by magnets 3 disposed at the backs of targets 4. Discharge gas inlet port 9 is disposed near the side of target 4. Argon gas as discharge gas is introduced from gas inlet port 9 into a vacuum chamber in which paired targets 4 are disposed. After introducing the gas, DC voltage from DC power source 8 is applied to paired targets 4, thereby generating plasma enclosed in the magnetic field.

Also, in the space between substrate 5 and shield cover 1, there is provided gas outlet port 6 for introducing oxygen gas as reaction gas. Further, electrode 7 connected to high-frequency power source 2 for generating plasma gas is disposed in outlet port 6. It is preferable to dispose gas outlet port 6 at the front or back side of electrode 7. These are arranged in vacuum chamber 10, and after forcing the air out of the vacuum chamber by means of a vacuum pump (not shown), plasma is generated by introducing discharge gas. Particles sputtered from targets 4 due to the plasma then generated react with plasma produced in the vicinity of electrode 7 disposed near substrate 5, and then, for example, an oxide thin film is formed on the surface of substrate 5.

In such a reactive sputtering apparatus using a conventional facing-targets sputtering system, electrode 7 connected to high-frequency power source 2 for generating reaction gas plasma is disposed in the vicinity of substrate 5. Accordingly, substrate 5 is exposed to plasma with a high electron temperature, and the thin film formed on the surface of substrate 5 is damaged by plasma while the film is formed. Further, since substrate 5 is heated by plasma, there is a problem that the thin film cannot be formed at a desired temperature of the substrate.

To cope with such a problem, disclosed in Japanese Laid-open Patent H6-252098 is an apparatus for executing surface treatment by applying an activated neutral particle beam to the substrate. A high-density neutral particle beam is produced from a high-density ion beam, and the neutral particle beam enables surface treatment at a higher speed. FIG. 5 is a sectional outline drawing of the plasma source.

The plasma source comprises plasma chamber 15, after-glow transport chamber 18 and treating chamber 24. That is, plasma 100 is generated by discharging gas in plasma chamber 15. In after-glow transport chamber 18, plasma 100 is taken out as after-glow, and also, while plasma after-glow 102 is transported, ions contained therein are neutralized to make neutral particles. In treating chamber 24, the neutral particles produced in after-glow transport chamber 18 are introduced for executing surface treatment of substrate 25. In this configuration, only neutral particles are applied to substrate 25, and it is possible to execute surface treatment without charge-up even if the object to be treated is a nonconductor.

A specific configuration of the plasma source will be described in the following.

Plasma chamber 15 is able to generate microwave plasma by using electron cyclotron resonance (ECR). That is, ECR electromagnet 11 is disposed at the outer periphery of plasma chamber 15, and microwaves transmitted by wave guide 13 are introduced through window 12. Also, first gas guide 14 is disposed in plasma chamber 15, and discharge gas is supplied from first gas guide 14.

Opening 16 is provided at the boundary position between plasma chamber 15 and after-glow transport chamber 18, and plasma 100 generated in plasma chamber 15 is taken out as plasma after-glow 102 into after-glow transport chamber 18 through opening 16.

At after-glow transport chamber 18, magnetic field shaping electromagnet 17 is wound on the outer periphery thereof. Thus, static magnetic field 104 is formed in the direction from plasma chamber 15 to treating chamber 24. Also, at the inner periphery of after-glow transport chamber 18 is disposed a ring-shaped gas outlet port 19, and the charge-exchange gas supplied from second gas feeding pipe 20 is supplied from gas outlet 19 to plasma after-glow 102.

Accordingly, plasma after-glow 102 is transported in the direction of treating chamber 24 with its diameter restricted to a specific shape by static magnetic field 104. In this way, positive ions contained in plasma after-glow 102 turn into an ion beam with its sputtering direction controlled. The ion beam is neutralized due to charge-exchange reaction with the charge-exchange gas during the process. As a result, a neutral particle beam having the same sputtering direction is formed. At this stage, electrons and negative ions or positive ions are remaining in the neutral particle beam.

At the boundary position between after-glow transport chamber 18 and treating chamber 24, there are provided electron repulsion electrode 21 and ion repulsion electrode 22 disposed adjacent to each other. Electrons and negative ions remaining in the neutral particle beam are repulsively removed by electron repulsion electrode 21. On the other hand, positive ions having passed electron repulsion electrode 21 are repulsively removed by ion repulsion electrode 22. Consequently, only neutral particle beam 106 is introduced into treating chamber 24.

Treating chamber 24 can be exhausted desired vacuum level by means of a vacuum pump (not shown) connected to exhaust port 23. Also, substrate holder 26 is disposed therein, and substrate 25 is fitted to substrate holder 26.

However, when such a plasma source is used as a plasma source for reaction shown in FIG. 4, there are problems as mentioned in the following. That is, neutral particle beam 106 thus formed is not uniform in its diametric direction, and a thin film formed by neutral particle beam 106 through reaction is liable to become non-uniform in its film quality and in-plane distribution of film thickness. Also, neutral particle beam 106 is sometimes sputtered toward the targets and reacts with the target material, causing a compound to be produced on the target surface. As a result, arc discharge is generated at the surface of the target during the sputtering operation, and there may arise generation of unstable sputtering and also splash in the thin film formed.

The present invention is intended to solve the conventional problem described above, and the object is to provide a facing-targets sputtering apparatus which is able to prevent reaction plasma from intruding toward the target and to prevent the generation of arc discharge during the sputtering operation, wherein the manufactured thin film is free from damage due to plasma, and uniform in its in-plane distribution.

SUMMARY OF THE INVENTION

The sputtering apparatus of the present invention comprises:
a vacuum chamber;
paired targets disposed in the vacuum chamber;
a substrate holder disposed at a position nearly perpendicular to opposing surfaces of the paired targets and apart from a space between the opposing surfaces of the paired targets;
a plasma source for generating reaction plasma by afterglow plasma in the vicinity of the substrate holder; and
a lead-in pipe which connects the plasma source to the vacuum chamber.

In this configuration, since reaction plasma formed of after-glow plasma can be produced in the vicinity of the substrate holder, it is possible to form a compound film being close to bulk characteristics and free from damage by plasma at a relatively low substrate temperature.

DETAILED DESCRIPTION OF THE EXEMPLARY EMBODIMENT

The whole configuration of a facing-targets sputtering apparatus related to the exemplary embodiment of the present invention will be described in the following with reference to FIG. 1 to FIG. 3B.

Figure 1:
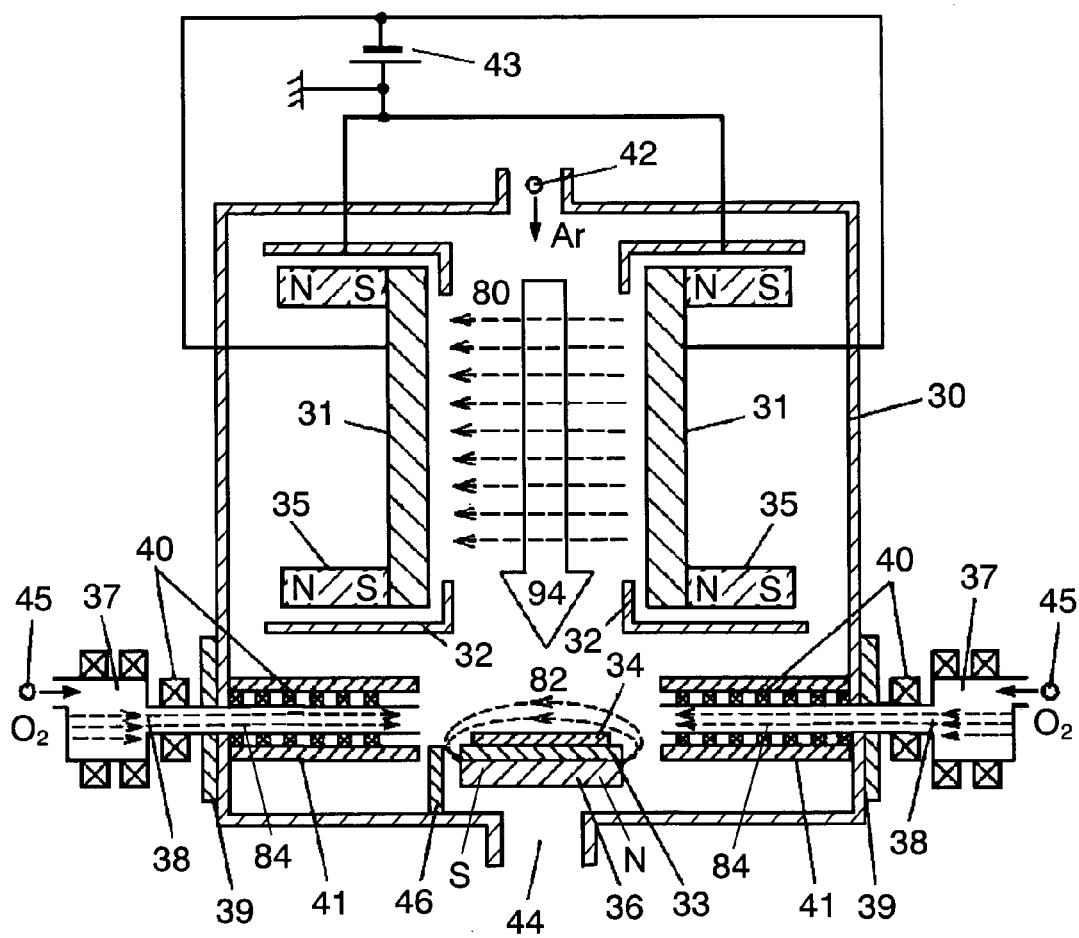
FIG. 1 is a sectional outline drawing showing the configuration of a sputtering apparatus in the exemplary embodiment of the present invention.
Figure 2:
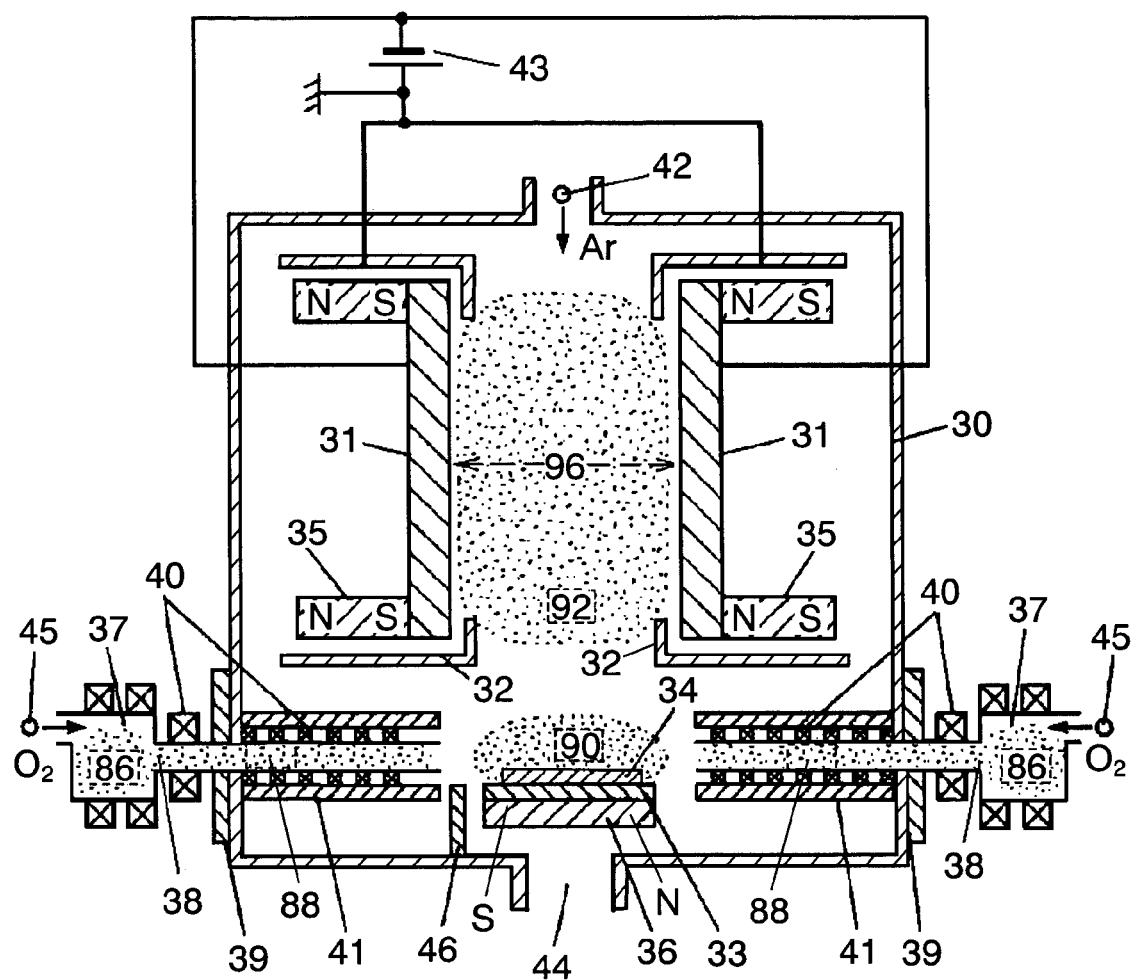
FIG. 2 is an explanatory diagram showing a plasma distribution formed by the sputtering apparatus of the exemplary embodiment.
Figure 3A:
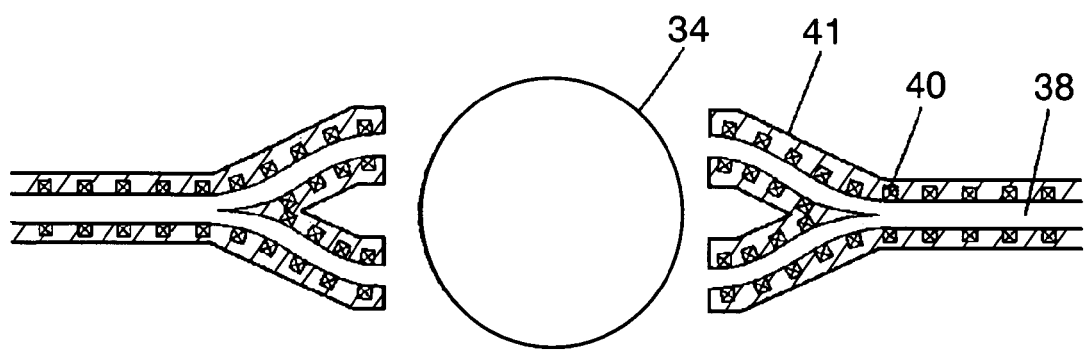
FIG. 3A and FIG. 3B are sectional outline drawings showing the branch structure of the tip portion of a lead-in pipe used in the sputtering apparatus of the exemplary embodiment.
Figure 3B:
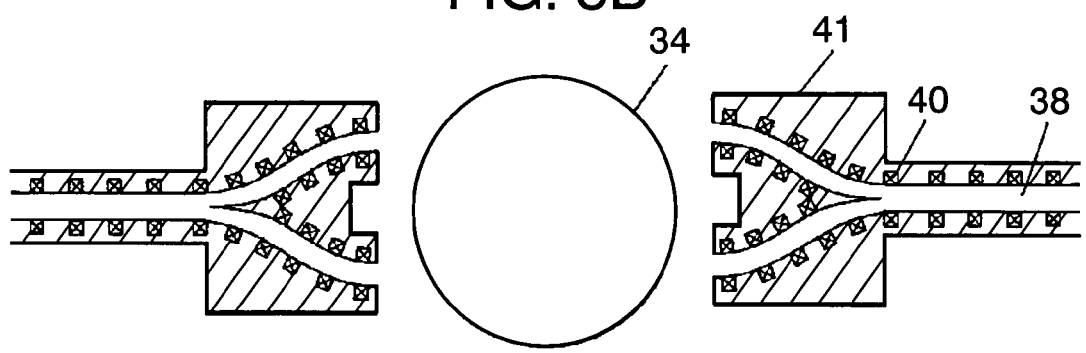

FIG. 1 is a sectional outline drawing showing the configuration of a sputtering apparatus of the present invention. FIG. 2 is an explanatory drawing showing a plasma distribution formed by the sputtering apparatus of the present invention. FIG. 3A and FIG. 3B are sectional outline drawings showing the branch structure of the tip portion of a lead-in pipe used in the sputtering apparatus of the present invention.

In FIG. 1 and FIG. 2, paired targets 31 are disposed in vacuum chamber 30, which are spaced apart, opposed and nearly parallel to each other. Substrate holder 33 is disposed at a position apart from a space formed by the surfaces of paired targets 31. The distance between paired targets 31 is in a range from about 100 mm to 180 mm, and the distance from substrate 34 to the central axis that connects the centers of opposing surfaces of paired targets 31 is preferably in a range from about 100 mm to 180 mm. However, although it is possible to further increase the distance depending upon the substrate shape used, the ratio of the distance between paired targets 31 to the distance between the central axis and substrate 34 is preferably about the same as mentioned above.

Also, as paired targets 31, it is desirable to use conductive targets whose resistivity is about 0.01 Ω·cm. Plasma detector 46 for monitoring the plasma parameters of reaction plasma is disposed in the vicinity of substrate holder 33. The plasma detector 46 is preferably disposed within 5 mm from the outer periphery of substrate holder 33. As plasma detector 46, for example, a plasma spectroscopic analyzer, Langmuir probe, or an optical analyzer such as an absorption spectrophotometer and a fluorescence analyzer can be employed.

On substrate holder 33 is disposed substrate 34 in such a manner as to be opposed to the space formed by paired targets 31. At the back sides of paired targets 31 are respectively disposed first magnets 35 for forming magnetic field 80 in a space formed by paired targets 31 and enclosing the plasma for sputtering. And, the paired first magnets 35 are disposed with the respective opposing portions paired in polarity. In this arrangement, magnetic field 80 is formed from one of targets 31 toward the other. As the material for first magnet 35, it is possible to use various well-known magnets such as Alnico magnet, ferrite magnet, samarium-cobalt alloy magnet, and neodymium-iron-boron alloy magnet.

At the opposite side of the position where substrate 34 of substrate holder 33 is installed or at the outer periphery of the portion where substrate 34 is installed, there is provided a reaction plasma enclosing magnet 36 (hereinafter, called second magnet 36) for forming magnetic field 82 parallel to the surface of substrate 34 and enclosing a plasma for reaction. As second magnet 36, it is also possible to use various well-known magnets the same as for first magnet 35. Also, shield cover 32 is disposed in order to cover the outer periphery of the surface of target 31. The shield cover 32 is connected to the ground as shown.

Outside the vacuum chamber 30 is arranged a plurality of plasma sources 37, and vacuum chamber 30 is connected to plasma sources 37 by lead-in pipes 38. It is desirable to arrange a plurality of lead-in pipes 38 in symmetrical positions about substrate 34. As illustrated in FIGS. 1 and 2, the lead-in pipes 38 each preferably include an interior pipe portion located inside the vacuum chamber 30, and an exterior pipe portion located outside the vacuum chamber 30. The DC power source, high-frequency power source or micro-wave power source (not shown) used for power supply to plasma source 37 is preferably the same in quantity as plasma source 37, and it is also preferable to supply power to a plurality of plasma sources 37 from a single unit. The material for lead-in pipe 38 is preferably non-magnetic and excellent in heat resistance as is represented by quartz glass. If a magnetic material is used for lead-in pipe 38, magnetic field 84 generated by magnetic field generator 40 installed in lead-in pipe 38 is not effectively applied to the inside of lead-in pipe 38, and therefore, it is not preferable to use a magnetic material. As magnetic field generator 40, it is also preferable to generate a magnetic field by applying a current to a coil or to use a permanent magnet.

As the shape of lead-in pipe 38, various shapes such as a cylindrical shape or a rectangular shape can be adopted. For example, the shapes of lead-in pipe 38 are compared. In the comparison, when the sectional diameter of a cylindrical shape is equal to the length of one side of the sectional square shape of rectangular shape, plasma distinction due to surface re-coupling at the pipe wall is less in the case of the rectangular shape and it is easier to obtain high-density after-glow plasma, and therefore, a rectangular shape is more advantageous as the shape of lead-in pipe 38.

There is provided magnetic shield 39 around the connection region of lead-in pipe 38 and vacuum chamber 30. As the magnetic shield 39, it is possible to use soft magnetic plate materials such as soft iron, Permalloy, and ferrite, and other various well-known magnetic shield materials. With magnetic shield 39 disposed, a field generated from the region disposed outside the vacuum chamber out of magnetic field generator 40 installed in lead-in pipe 38 and a field generated at plasma source 37 can be magnetically shielded outside the vacuum chamber 30. Accordingly, these fields can be prevented from getting into vacuum chamber 30, and there is no interference of these fields with the magnetic field and plasma distribution generated in vacuum chamber 30. That is, it becomes possible to independently best control the respective fields outside and inside the vacuum chamber 30. Incidentally, the distributions of magnetic field 80 and magnetic field 82 by using a Gauss meter are measured and they are just as designed. In this way, it has been confirmed that the field generated outside the vacuum chamber 30 is not affecting the inside of vacuum chamber 30.

FIG. 3A and FIG. 3B are sectional outline drawings showing the branch structure of a tip portion of lead-in pipe 38 with respect to substrate 34. It is a top view of substrate 34, and lead-in pipe 38 is shown by a cross-section in a direction parallel to the surface of substrate 34.

As shown in FIG. 3A and FIG. 3B, lead-in pipe 38 is branched into at least a plurality of pipes and extended to a position near substrate 34. All the pipes branched from lead-in pipe 38 are the same in shape. That is, the distance from the end of the plasma lead-in side of lead-in pipe 38 to the end of the plasma outlet side is set so that it remains the same with respect to any route of the branched pipes. Also, lead-in pipe 38 is provided with magnetic field generator 40 for generating a magnetic field parallel to the direction of the pipe axis of lead-in pipe 38, which is located between plasma source 37 and vacuum chamber 31. The outer periphery of magnetic field generator 40 is covered with lead-in pipe cover 41 made of soft magnetic material. Accordingly, it is possible to prevent the magnetic field generated by magnetic field generator 40 from interfering with the magnetic field distribution and plasma distribution in vacuum chamber 30.

In FIG. 3A and FIG. 3B, lead-in pipe 38 and field generator 40 are structurally the same in shape as described above, but the shape of lead-in pipe cover 41 in the plasma outlet zone is partially different. That is, in FIG. 3A, lead-in pipe cover 41 is formed in shape to be coaxial with lead-in pipe 38 including the branch portion. In this way, the installation space can be reduced. On the other hand, in FIG. 3B, the branch portion of lead-in pipe cover 41 is formed in such manner that the branched pipes can be integrally housed. In this way, lead-in pipe cover 41 can be easily manufactured. Regarding the shape of lead-in pipe cover 41, it is not limited to the shape described in FIG. 3A and FIG. 3B, but it is preferably configured so that after-glow plasma 88 is emitted toward substrate 34. Also, when lead-in pipe 38 is branched in the vacuum chamber, it is preferable to branch the pipe into three parts or more as well as into two parts as described above. Further, the emitting direction of after-glow plasma 88 at each branched outlet port is preferably directed toward the center of substrate 34. In this arrangement, the distribution reaction plasma 90 at the surface of substrate 34 can be made further uniform.

By using a facing-targets sputtering apparatus in the present embodiment having a configuration as described above, a reactive sputtering process for film-forming through reaction will be described with reference to FIG. 1 and FIG. 2. FIG. 2 is a diagram showing a state of plasma generation in the configuration of the apparatus shown in FIG. 1.

First, as shown in FIG. 1 and FIG. 2, reaction gas such as oxygen gas or hydrogen gas is introduced from reaction gas lead-in port 45 to plasma source 37. The reaction gas is excited by plasma source 37 such as DC plasma, high-frequency plasma, microwave plasma, electron cyclotron resonance plasma, helicon wave excitation plasma or inductively coupled excitation plasma, thereby producing high-density plasma 86. When oxygen gas is used as the reaction gas, in the result of measuring the electron density of high-density plasma 86 by using a Langmuir probe, the plasma obtained is very high in density of about $10^{11}$ to $10^{13}$ $cm^{-3}$.

High-density plasma 86 produced by plasma source 37 is guided by the gas flow of reaction gas introduced from reaction gas lead-in port 45 into lead-in pipe 38 as after-glow plasma 88. Around lead-in pipe 38 is provided field generator 40 for generating magnetic field 84 parallel to the pipe axis direction of lead-in pipe 38, and the diffusion in the pipe axis direction of after-glow plasma 88 can be suppressed by magnetic field 84. Accordingly, distinction of after-glow plasma 88 due to recombination at the surface can be suppressed at the pipe wall of lead-in pipe 38, and thereby, after-glow plasma 88 is able to maintain a status of high density.

Also, when oxygen gas or hydrogen gas is used as reaction gas, elastic collision is repeated between excited oxygen or hydrogen and electrons in after-glow plasma 88, and the electron temperature is rapidly lowered. Accordingly, it is possible to prevent the temperature of substrate 34 from increasing due to the electron temperature.

On the other hand, when nitrogen gas is used as the reaction gas, there exists a lot of nitrogen excited to a metastable level at after-glow plasma 88. Non-elastic collision takes place between such nitrogen being at a metastable level and electrons. As a result, the energy is applied to the electrons, then the electrons are re-heated, causing the electron temperature to rise. Accordingly, substrate 34 is heated by the high electron temperature and then increased, and the substrate temperature is liable to increase. However, nitrogen gas can be used in a thin-film process provided that the rise of the substrate temperature causes no problems.

Further, it is possible to use various gases such as ammonium gas, hydrocarbon gas, carbon dioxide gas, carbon monoxide gas, and silane gas.

After-glow plasma 88 is guided by the flow of reaction gas further to the side end of substrate holder 33 of lead-in pipe 38. And, after-glow plasma 88 is spouted from the end of lead-in pipe 38 toward substrate holder 33, forming reaction plasma 90 of high-density after-glow plasma at a low electron temperature in the vicinity of substrate holder 33. There are provided a plurality of plasma sources 37 and lead-in pipes 38. Also, as shown in FIG. 3A and FIG. 3B, lead-in pipe 38 is at least branched into a plurality of pipes in vacuum chamber 30 and extended up to a position near substrate holder 33, and the branched pipes are the same in passage length. Accordingly, it is possible to uniformly distribute reaction plasma 90 on the surface of substrate 34.

Also, substrate holder 33 is provided with second magnet 36 at the opposite position of substrate 34, and the second magnet 36 serves to generate magnetic field 82 parallel to the surface of substrate 34. Accordingly, reaction plasma 90 is uniformly distributed over the entire surface of substrate 34 in a state of being enclosed therein. Since reaction plasma 90 is high-density plasma at a low electron temperature, the thin film formed on the surface of substrate 34 is not damaged by reaction plasma 90, and also, the rise of the substrate temperature can be prevented. When magnetic field 84 of 1500 Gauss is generated in parallel to the pipe axis direction by using oxygen gas as reaction gas and cylindrical lead-in pipe 38 of 10 mm in diameter, the electron density of reaction plasma 90 is about $10^{10}$ $cm^{-3}$, and the electron temperature is 1 eV or lower, and it has been confirmed that high-density plasma at a low electron temperature can be obtained.

Also, it has been found as a result of measurement that the electron density at the surface of substrate 34 and the in-plane distribution of electron temperature are nearly uniform.

Thus, with reaction plasma 90 formed at the surface of substrate 34, sputter gas as represented by inert gas such as argon gas and crypton gas is introduced from sputter gas lead-in port 42. Next, a voltage with paired targets 31 as the cathode is applied from DC power source 43 connected to paired targets 31. Due to the voltage applied, sputter gas in a space formed by the opposed target surfaces of paired targets 31 is ionized, producing sputter plasma 92. Sputter plasma 92 sputters each of paired targets 31 by electric field 96.

At the back side of each of paired targets 31 is disposed first magnet 35, and magnetic field 80 is generated in a direction from one of paired targets 31 to the other. Due to the magnetic field 80 and electric field, sputter plasma 92 is enclosed in a space between the target surfaces of paired targets 31, and therefore, substrate 34 is not damaged because it is not exposed to sputter plasma 92. Sputter particles are sputtered in the direction of substrate 34 as well by sputter plasma 92. And, the sputter particles at the surface of substrate 34 react with reaction plasma 90 being produced on the surface of substrate 34, forming a thin film as a result of reaction on the surface of substrate 34. In the present embodiment, as shown in FIG. 1 and FIG. 2, oxide thin film can be formed because oxygen gas is used as reaction gas. When hydrogen gas is used as reaction gas, hydride thin film can be formed. Further, it is preferable to use other reaction gas.

Since reaction plasma 90 is produced with uniform in-plane distribution on the surface of substrate 34, a thin film is uniformly formed over the entire surface of substrate 34 as a result of uniform reaction.

Also, since exhaust port 44 is provided in the wall of vacuum chamber 30 located at the opposite side of the substrate position of substrate holder 33, gas flow 94 is generated in the direction of exhaust port 44 from the direction of paired targets 31. Also, reaction gas 90 is enclosed by second magnet 36 at the surface of substrate 34, and therefore, reaction plasma 90 will not intrude in the direction of target 31. Thus, paired targets 31 will not react with reaction plasma 90 at the surface thereof. Accordingly, no reaction product is produced on the surface of target 31 as a result of reaction between component of target and reactive particles in reaction plasma 90. As a result, it is possible to prevent the generation of arc discharge during the sputtering operation. In the sputtering operation, various plasma parameters for reaction plasma 90 are always monitored by plasma detector 46 installed in the vicinity of substrate holder 33 in order to control the status of reaction plasma by adjusting the flow rate of reaction gas and the power supplied to plasma source 37 so that a reaction product of intended composition can be obtained.

A specific example of an experiment using a sputtering apparatus of the present invention will be described in the following.

A silicon (Si) target with resistivity adjusted to 0.02 Ω·cm by boron doping was used as target 31. Argon gas as sputter gas of 50 sccm to 100 sccm and oxygen gas as reaction gas of 20 sccm to 40 sccm were introduced. A silicon (Si) wafer of 4 inches in diameter was used as substrate 34, and silicon oxide ($SiO_2$) thin film was formed on the silicon wafer. Paired targets 31 were supplied with power of 2 kW to 3 kW from DC power source 43, then sputter plasma 92 of argon plasma was generated in a space formed by paired targets 31 in order to sputter paired targets 31.

At the surface of substrate 34, high-density reaction oxygen plasma 90 is produced at electron density of $10^{10}$ $cm^{-3}$ and low electron temperature of 1 eV or lower. Under the above conditions, $SiO_2$ film was formed on the silicon wafer that is substrate 34. As a result, there was almost no generation of arc discharge during the sputtering operation, and the substrate temperature was 80° C. at the highest. Also, the sputtering speed was in a range from 40 nm/min to 60 nm/min, which was about 5 times higher as compared with ordinary magnetron sputtering.

In the composition analysis of $SiO_2$ film manufactured by using wavelength dispersive EPMA (Electron Probe Micro Analysis), the mole ratio was Si:O=1:2, and the film obtained was excellent in stoichiometric composition. Also, the refractive index of the film was measured by using a prism coupler to obtain 1.457 (wavelength 633 nm). This refractive index is equivalent to that of bulk $SiO_2$, and also, the in-plane distribution of refractive index on silicon wafer is less than 0.05%, and the result obtained is excellent.

Figure 4:
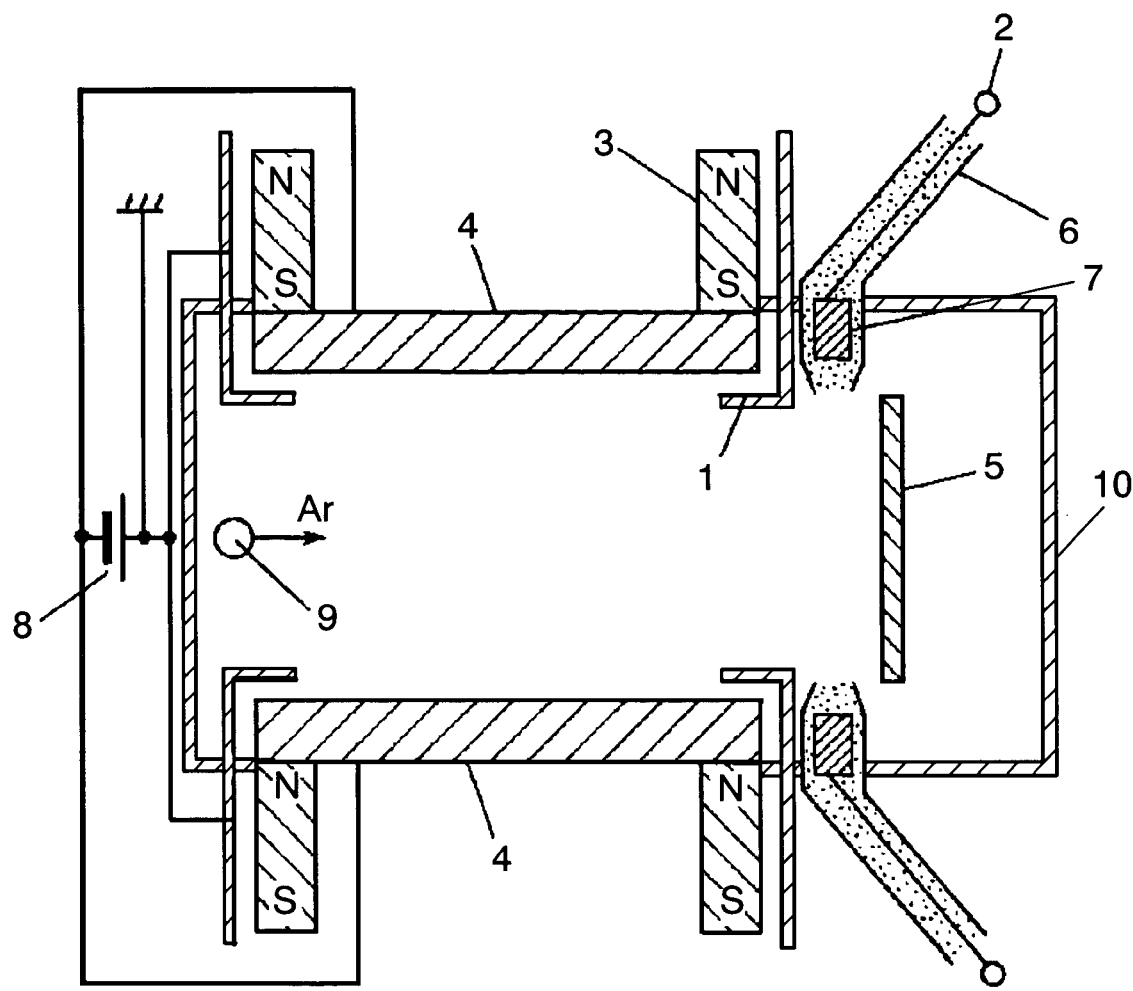
FIG. 4 is a sectional outline drawing of an essential portion of a conventional opposed-target sputtering apparatus.
Figure 5:
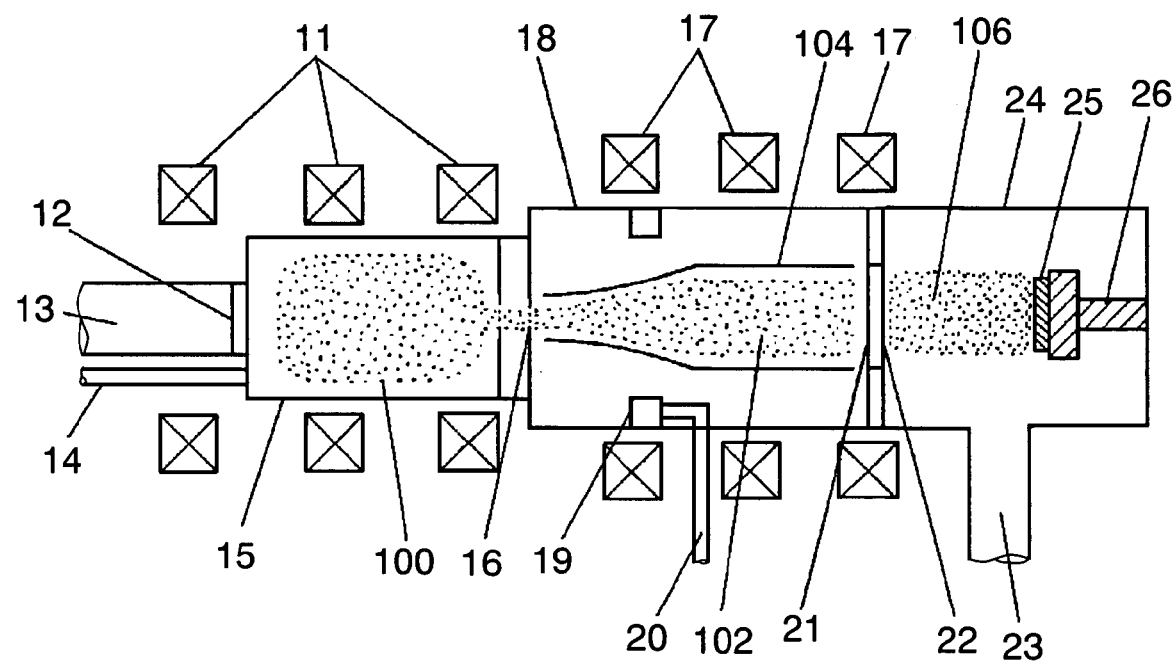
FIG. 5 is a sectional outline drawing of a conventional plasma source for executing surface treatment at a higher speed by using a neutral particle beam.

On the other hand, $SiO_2$ film was formed by using a conventional reactive sputtering apparatus as shown in FIG. 4. The substrate, target, sputter gas, and reaction gas used are the same as in the exemplary experiment in the present embodiment. When power of 2.0 kW or over is applied to the target, arc discharge was generated during the sputtering operation, and it was unable to control the film composition because of a lot of foreign matter was mixed in the film. Also, when the film was formed by applying power of 1.5 kW to the target, the substrate was heated due to ion collision generated by oxygen plasma in the vicinity of the substrate, causing the substrate temperature to become 130° C. or over. The sputtering speed was 20 nm/minor less, and the in-plane distribution of refractive index on silicon wafer became 0.08% or over.

As described above, in the facing targets sputtering apparatus of the present invention, reaction plasma 90 of high-density after-glow plasma produced by plasma source 37 disposed outside the vacuum chamber 30 is introduced onto the surface of substrate 34, and it can be enclosed with uniform in-plane distribution. As a result, sputter particles from paired targets 31, sputtered by sputter plasma 92, react with reaction plasma 90 on the surface of substrate 34, and a thin film of reaction product can be formed on substrate 34.

Also, since exhaust port 44 is provided in the wall of vacuum chamber 30 located at the opposite side of the substrate position of substrate holder 33, gas flow 94 can be generated in the direction of exhaust port 44 from the direction of paired targets 31. Thus, reaction plasma 90 sputtered in the direction of target 31 can be suppressed. And, no such reaction product is formed on the surface of target 31 due to reaction between target 31 and reaction plasma 90. Accordingly, it is possible to prevent the generation of arc discharge during the sputtering operation.

In the sputtering process in the present embodiment, after forming reaction plasma 90 at the surface of substrate 34, sputter plasma 92 is generated for film forming purpose as described, but the present invention is not limited to this. For example, it is preferable to employ such a method that the surface of substrate 34 is covered with a shutter (not shown) so that sputter particles are not sputtered onto substrate 34, and after generating sputter plasma 92, reaction plasma 90 is formed at the surface of substrate 34, followed by opening the shutter (not shown) for the purpose of forming film.

In the present invention, it is desirable to use oxygen gas or hydrogen gas as the gas introduced into the plasma source as described above. Elastic collision is repeated between excited oxygen or hydrogen and electron in after-glow plasma, and the electron temperature can be rapidly lowered, and therefore, the substrate is not subjected to electron impact, thereby preventing the substrate temperature from increasing, and it is possible to form good-quality oxide thin film or hydride thin film at a low temperature.

What is claimed is:

1. A sputtering apparatus comprising:
   a vacuum chamber;
   paired targets disposed in said vacuum chamber and having opposing surfaces facing one another such that a space is formed between said opposing surfaces of said paired targets;
   a substrate holder disposed in a position apart from said space formed between said opposing surfaces of said paired targets, said substrate holder being positioned so as to be nearly perpendicular to said opposing surfaces of said paired targets;
   a plasma source for generating reaction plasma by after-glow plasma in the vicinity of said substrate holder;
   a lead-in pipe connecting said plasma source to said vacuum chamber, said lead-in pipe connecting to said vacuum chamber at a lead-in pipe connection part;
   magnetic field generators arranged to generate a magnetic field parallel to an axial direction of said lead-in pipe;
   a soft magnetic material circumferentially surrounding at least one of said magnetic field generators; and
   a magnetic shield provided at said lead-in pipe connection part to magnetically shield an interior of said vacuum chamber from said plasma source;
   wherein said lead-in pipe includes an exterior pipe portion disposed outside said vacuum chamber, and an interior pipe portion disposed inside said vacuum chamber;
   wherein at least one of said magnetic field generators is disposed about said interior pipe portion; and
   wherein said soft magnetic material circumferentially surrounds said interior pipe portion by surrounding said at least one of said magnetic field generators disposed about said interior pipe portion.

2. The sputtering apparatus of claim 1, wherein
   at least another one of said magnetic field generators is disposed about said exterior pipe portion.

3. The sputtering apparatus of claim 1, wherein
   said magnetic shield comprises a magnetic shield plate provided on an outside of said vacuum chamber and surrounding said lead-in pipe.

4. The sputtering apparatus of claim 3, wherein
   at least another one of said magnetic field generators is disposed about said exterior pipe portion.

5. The sputtering apparatus of claim 1, wherein
   said plasma source constitutes a first plasma source, and said lead-in pipe constitutes a first lead-in pipe;
   a second plasma source is provided for generating reaction plasma by after-glow plasma in the vicinity of said substrate holder; and
   a second lead-in pipe connects said second plasma source to said vacuum chamber.

6. The sputtering apparatus of claim 1, wherein
   said plasma source is configured to receive oxygen gas or hydrogen gas.

7. The sputtering apparatus of claim 1, wherein
   said substrate holder has a substrate side facing toward said space formed between said opposing surfaces of said paired targets for supporting a substrate, and an opposite side opposite said substrate side; and
   a reaction plasma enclosing magnet is disposed at said opposite side or outer periphery of said substrate holder for generating a magnetic field parallel to a surface of a substrate held on said substrate holder to enclose a reaction plasma.

8. The sputtering apparatus of claim 1, wherein
   said lead-in pipe is branched into at least two pipe branches in said vacuum chamber and extends to a position near said substrate holder.

9. The sputtering apparatus of claim 1, wherein
   said substrate holder has a substrate side facing toward said space formed between said opposing surfaces of said paired targets for supporting a substrate, and an opposite side opposite said substrate side; and
   an exhaust port is provided in a wall of said vacuum chamber facing said opposite side of said substrate holder.

10. The sputtering apparatus of claim 1, wherein
    said plasma source is at least one selected from the group consisting of a DC plasma source, a high-frequency plasma source, a microwave plasma source, an electron cyclotron resonance plasma source, a helicon wave excitation plasma source, and an inductively coupled excitation plasma source.

11. The sputtering apparatus of claim 1, further comprising
    a plasma detector disposed in the vicinity of said substrate holder for detecting a state of plasma.

* * * * *